United States Patent [19]
Liaw

[11] Patent Number: 6,115,911
[45] Date of Patent: Sep. 12, 2000

[54] METHOD OF MANUFACTURING A PLUG

[75] Inventor: Been-Yu Liaw, Tai-Chung, Taiwan

[73] Assignee: World Wiser Electronics Inc., Taoyuan Hsien, Taiwan

[21] Appl. No.: 09/246,773

[22] Filed: Feb. 8, 1999

[30] Foreign Application Priority Data

Dec. 31, 1998 [TW] Taiwan ................................. 87121966

[51] Int. Cl.$^7$ ...................................................... H05K 3/34
[52] U.S. Cl. .................. 29/840; 29/833; 29/846; 29/852; 429/97; 174/262; 427/10
[58] Field of Search ............................. 29/833, 846, 852; 429/97; 174/262; 427/10

[56] References Cited

U.S. PATENT DOCUMENTS

| | | | |
|---|---|---|---|
| 4,428,852 | 1/1984 | Covington, Jr. et al. | 252/62.56 |
| 4,435,442 | 3/1984 | Hefele | 427/14.1 |
| 4,478,519 | 10/1984 | Guibert | 366/157 |
| 4,772,485 | 9/1988 | Ebata | 427/8 |
| 4,888,199 | 12/1989 | Felts et al. | 427/10 |
| 5,641,438 | 6/1997 | Bunyan et al. | 264/40.3 |
| 5,804,248 | 9/1998 | Hewett | 427/96 |
| 5,912,984 | 6/1999 | Michael et al. | 382/149 |

*Primary Examiner*—Lee Young
*Assistant Examiner*—Kevin G. Vereene
*Attorney, Agent, or Firm*—J.C. Patents; Jiawei Huang

[57] ABSTRACT

An apparatus for manufacturing plug and the manufacturing method is described. The method comprises providing a baseplate on a bottom surface of a sealed printing chamber. The printed circuit board and a stencil on the baseplate are sequentially mounted on the baseplate. Several cameras are used to align the holes of the printed circuit board and the stencil. A proper amount of preheated paste is printed on the stencil. The sealed printing chamber is adjusted to a first pressure to perform a paste-printing step for filling the hole of the printed circuit board with paste. The sealed printing chamber is adjusted to a second pressure. The sealed printing chamber is adjusted to a third pressure to perform a scraping step for remove redundant paste.

8 Claims, 4 Drawing Sheets

METHOD OF MANUFACTURING A PLUG

CROSS-REFERENCE TO RELATED APPLICATION

This application claims the priority benefit of Taiwan application Ser. No. 87121966, filed Dec. 31, 1998, the full disclosure of which is incorporated herein by reference.

BACKGROUND OF THE INVENTION

1. Field of the Invention

The invention relates in general to an apparatus and method for manufacturing plugs, and more particularly to an apparatus and method of manufacturing plugs for a blind via and a micro via and an image alignment apparatus.

2. Description of the Related Art

High-Density Interconnection (HDI) technology is usually required to form a micro via and a blind via. These vias are formed by several advanced technologies, including Laser Ablation, Plasma Etching, Photo Imageable Dielectric (PID) films and Mechanical Drilling. The typical size of these via are around 2~6 mils in diameter. They are widely used in Printed Circuit Boards (PCB), Multi-Chip Module-Laminates (MCM-L), ceramic substrates, thick film devices and Integrated Circuit Packaging Carriers such as Ball Grid Arrays (BGA), Chip Scale Packages (CSP) and so on.

Solid masks (S/M), epoxies, or conductive pastes, such as silver, copper or silver-copper mixed pastes, are commonly used to plug these micro vias and blind vias. This process is known as a plug process. Because the micro vias are very small, it is very hard to form bubble-free plug.

A stencil is aligned to the board by using the conventional stencil printer process. The conventional printer simply applies a lot of paste on the stencil. A squeegee is then used to plug these vias with paste.

However, the typical size of these vias is around 2~6 mils in diameter. By using the conventional Surface Mount Technology (SMT) screen printer or stencil printer to plug these vias, a problem of voids arises. The voids produced during the printing process are harmful to the reliability test. Moreover, entrapped bubbles can be formed in the paste and voids can be formed in the plug during the printing processes due to exposure to the atmosphere.

The paste usually consists of flux and solvent and its viscosity continues to change as the solvent evaporates during the printing processes. The conventional printer simple applies the paste onto the stencil exposed to the air, and then mixes the paste. Therefore, bubbles can be trapped in the paste during the mixing step. It is easy to form voids in the plug. Meanwhile, the solvent evaporates, accompanied by changes in the paste's viscosity. So there is no way to keep a constant quality of paste during the conventional process.

The precise alignment between the stencil and the PCB is not achieved by conventional process due to the small dimension of the via. The conventional method fixes the stencil first. The cameras are aligned to the stencil by the fiducial mask on the stencil. The cameras are then moved out of the printing region. The board is aligned to the cameras and then moved into the printing area. In most conventional printers, the board has to move to the printing area after each alignment which may introduce and acaccumulate alignment inaccuracies. Therefore, at least one re-alignment step is performed after several printing processes.

SUMMARY OF THE INVENTION

It is therefore an object of the invention to provide a manufacturing apparatus for a plug that is able to avoid the occurrence of voids in the plug during the manufacturing process of micro vias or blind vias.

It is another object of the invention to provide a mixing apparatus that is able to isolate the paste from air and prevent bubbles from being trapped in the paste while the paste is mixed.

It is yet another object of the invention to provide a method of manufacturing a plug that is able to avoid the occurrence of voids in the plug and increase the reliability of the package.

It is still another object of the invention to provide an image alignment apparatus to avoid introducing and accumulating alignment inaccuracies.

The invention achieves the above-identified objects by providing an apparatus for manufacturing plugs. The apparatus includes a sealed printing chamber connected to a pressure control unit for controlling the pressure of the sealed printing chamber. The sealed printing chamber further comprises a transparent window mounted on the top surface of the sealed printing chamber. Several cameras are mounted on the outside of the transparent window for alignment. A baseplate having a heating unit is mounted on a bottom surface of the sealed printing chamber. The sealed printing chamber further comprises a paste provider, which can be used for mixing and storing paste.

The invention achieves the above-identified objects by providing a method for manufacturing plug. The method comprises providing a baseplate on a bottom surface of a sealed printing chamber. The printed circuit board and a stencil on the baseplate are sequentially mounted on the baseplate. Several cameras are used to align the holes of the printed circuit board and the stencil. A proper amount of preheated paste is printed on the stencil. The sealed printing chamber is adjusted to a first pressure to perform a printing step with the paste to fill the hole of the printed circuit board with paste. The sealed printing chamber is adjusted to a second pressure. The sealed printing chamber is then adjusted to a third pressure to perform a scraping step to remove redundant paste.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
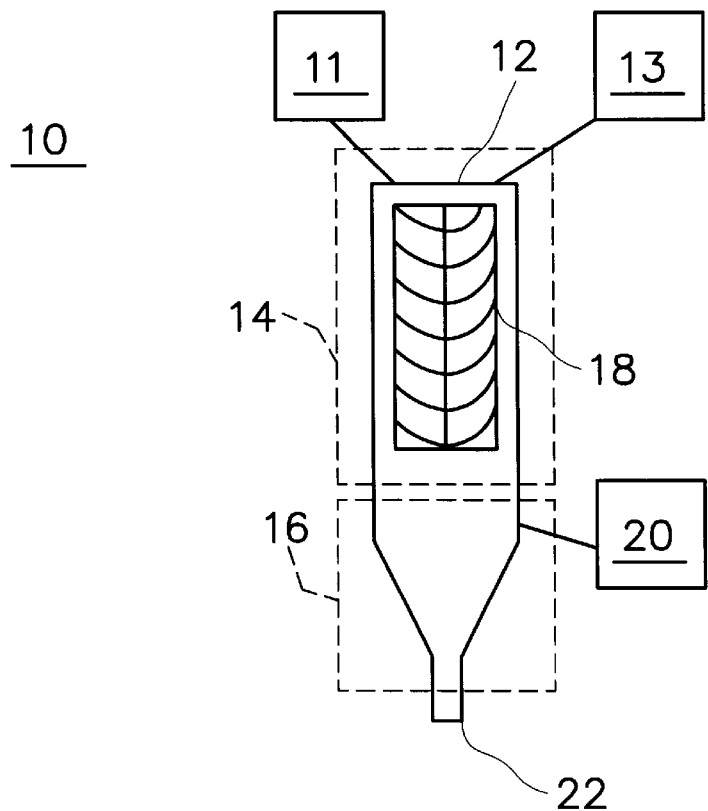
FIG. 1 is schematic diagram showing an apparatus for mixing paste according to one preferred embodiment of the invention.

FIG. 1 is schematic diagram showing an apparatus for mixing paste according to one preferred embodiment of the invention.

Referring to FIG. 1, a mixing apparatus for a paste 10 comprising a vacuum chamber 12 is provided. The vacuum chamber 12 consists of two storage tanks that are used for storing paste and solvent in the vacuum chamber 12. One is source tank 11 for paste and another is source tank 13 for solvent. The vacuum chamber 12 is a sealed chamber and is maintained at an acceptable degree of vacuum. The vacuum chamber 12 can be divided into two regions. One is a mixing region 14, comprising a mixing apparatus 18, for example, a twin screw, which achieves the proposed mixing by the helical motion of two stirrers. Another is a storage region 16, comprising a heating unit 20 and an outlet opening 22. The heating unit 20 is used for heating the pre-mixed paste to reduce its viscosity so that the subsequent step of paste application is achieved easily. The heated and mixed paste is exported by the outlet opening 22 in the paste process.

The mixing and storage steps are performed in vacuum chamber 12, hence no bubbles are trapped in the paste during the process of mixing the paste. Therefore, the mixed paste is bubble free paste. Additionally, the vacuum chamber 12 prevents the paste from contact with air during storage, so the probability of forming bubbles in the paste in the subsequent process of plug formation is reduced.

Figure 2:
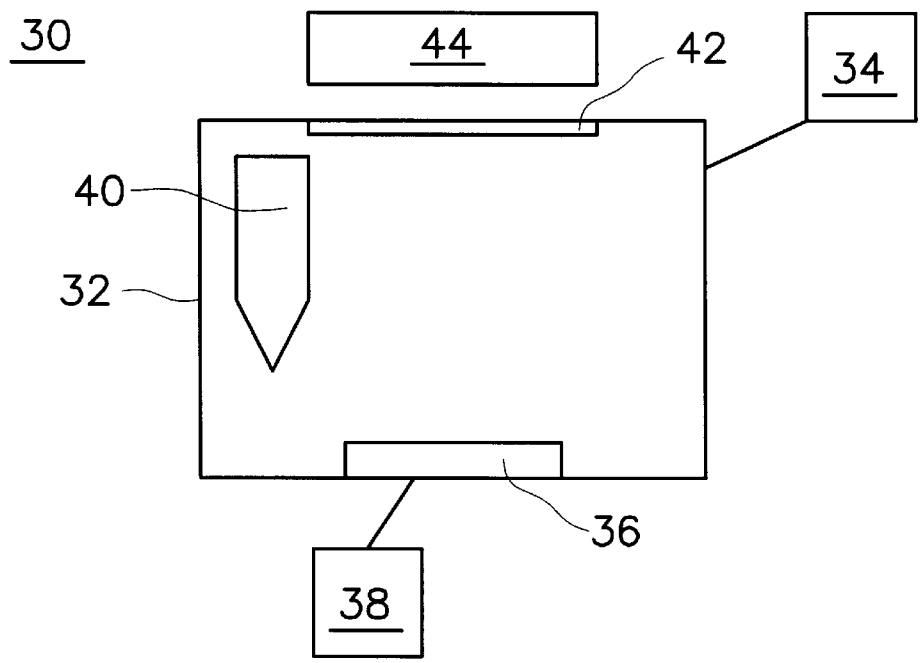
FIG. 2 is schematic diagram showing an apparatus for manufacturing a plug according to one preferred embodiment of the invention.

FIG. 2 is schematic diagram showing an apparatus for manufacturing plugs according to one preferred embodiment of the invention.

Referring to FIG. 2, an apparatus 30 for manufacturing plugs comprising a sealed printing chamber 32 is provided. The sealed printing chamber 32 is an operation region for manufacturing plugs in a printed board. The sealed printing chamber 32 is connected to a pressure control unit 34 which is used to control the pressure of the sealed printing chamber 32. A baseplate 36 having a heating unit 38 is located on the bottom of sealed printing chamber 32. The baseplate 36 is used for mounting a printed board when plugs are to be formed in the printed board. The heating unit 38 is used for heating the paste on the printed board mounted on the baseplate 36. A transparent window 42 for aligning the printed board and stencil is located on the top of the sealed printing chamber 32. A paste source tank 40 for providing paste is located inside the sealed printing chamber 32. The preferred paste source tank 40 is the paste mixing apparatus 10 as illustrated in FIG. 1. The paste source tank 40 has functions of mixing and storing the paste in a vacuum condition. The paste source tank 40 can be a simple container as long as it can provide the premixed paste to the baseplate 36.

Figure 3:
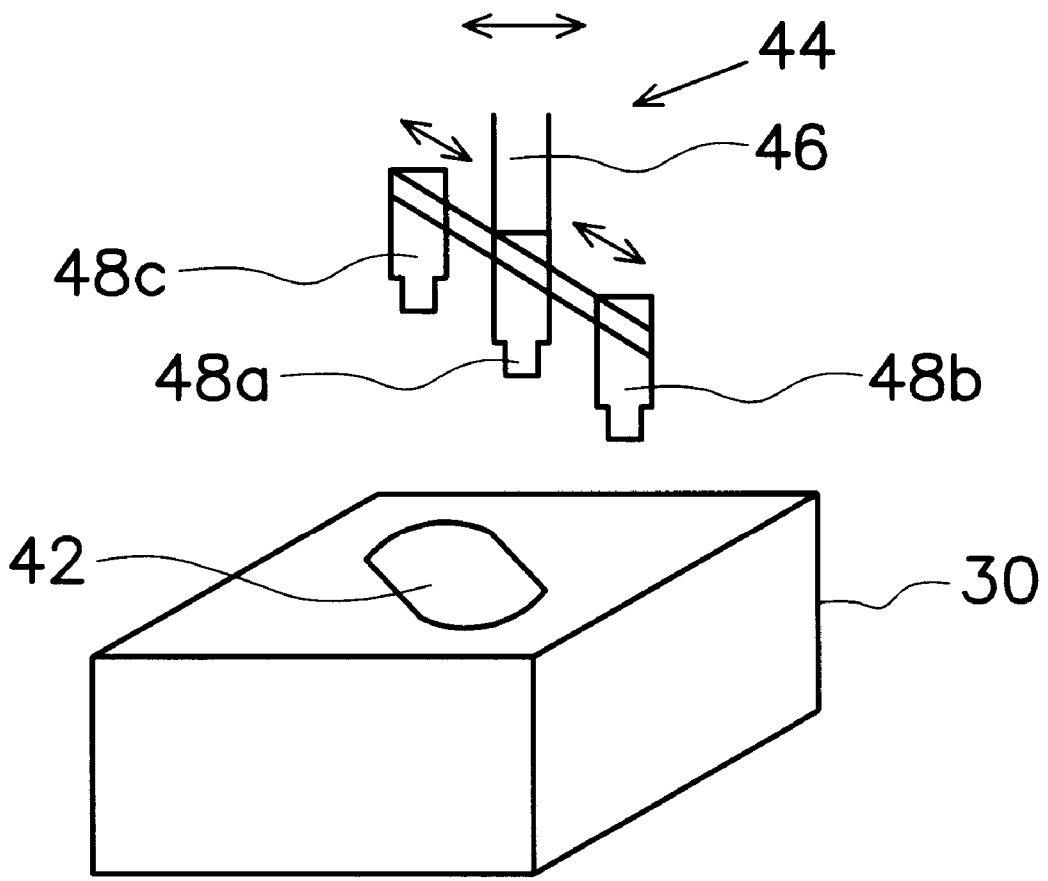
FIG. 3 is schematic diagram showing an apparatus for aligning an image according to one preferred embodiment of the invention.

FIG. 3 is schematic diagram showing an apparatus for aligning an image according to one preferred embodiment of the invention.

Referring to FIG. 3, an image alignment apparatus 44 having a support 46 and three cameras 48a, 48b, 48d is located on the transparent window 42 of the sealed printing chamber 32. Camera 48a is located on the central portion while cameras 48b and 48d are located on opposite sides of the support 46. The distance between camera 48a and cameras 48b and 48d can be adjusted properly.

A stencil (not shown) located in the printing chamber 32 is static during the alignment process. Camera 48a is aligned by fiducial marks on the central portion of the stencil. Cameras 48b and 48d are aligned by fiducial marks on the edge of the stencil. After the alignment step is performed the cameras 48a, 48b and 48d remain stationary unless the size of the package board is changed. The printed circuit board is then moved so that it is aligned. The key point for the present invention is that both the cameras and the stencil are static; the only thing moving is the printed circuit board. Thus, no further movement of the stencil and board occurs. However, in most conventional printers, the printed circuit board has to move to the printing area after each alignment which may introduce and accumulate alignment inaccuracies. In the present invention, the distances between the camera 48a and cameras 48b and 48d can be changed once the sizes of the stencil and printed circuit board are changed. Therefore, the present invention can be used for various sizes of printed circuit board.

Figure 4A:
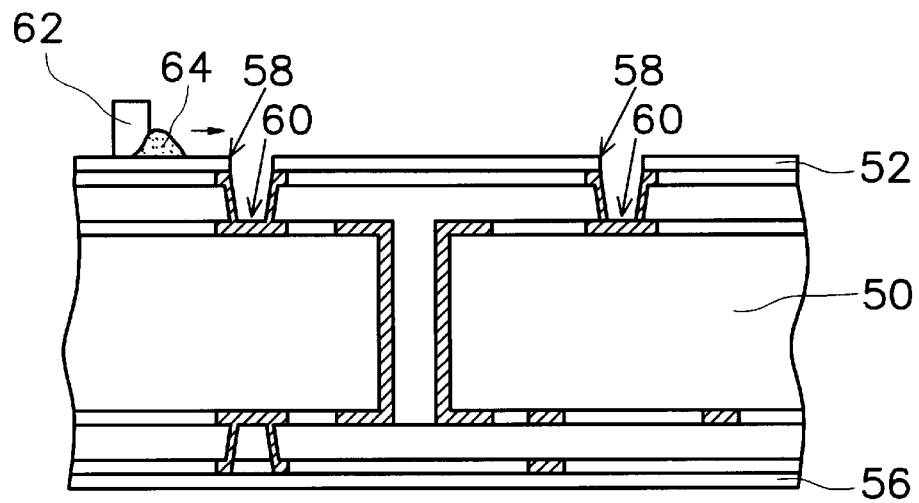
FIGS. 4A to 4C are schematic cross-sectional views showing the process steps of one preferred embodiment of the invention for manufacturing a plug.
Figure 4B:
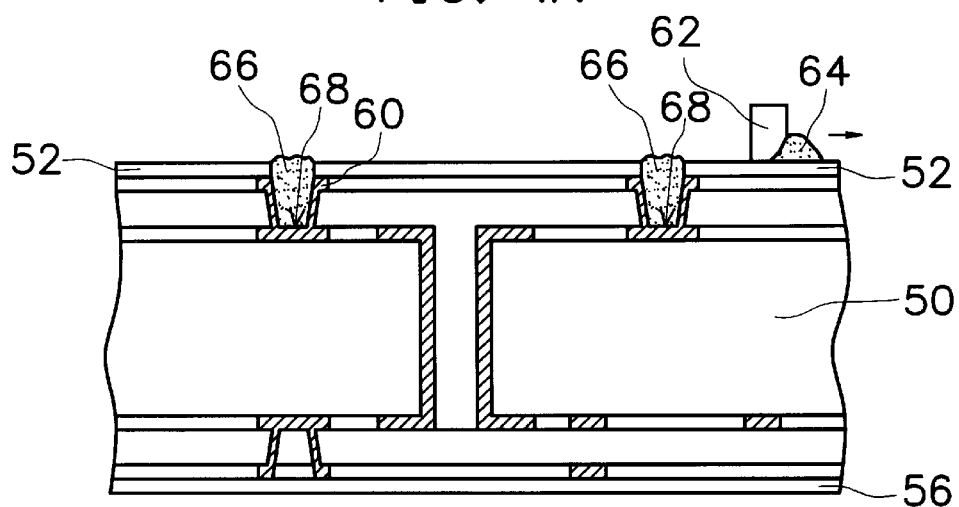
Figure 4C:
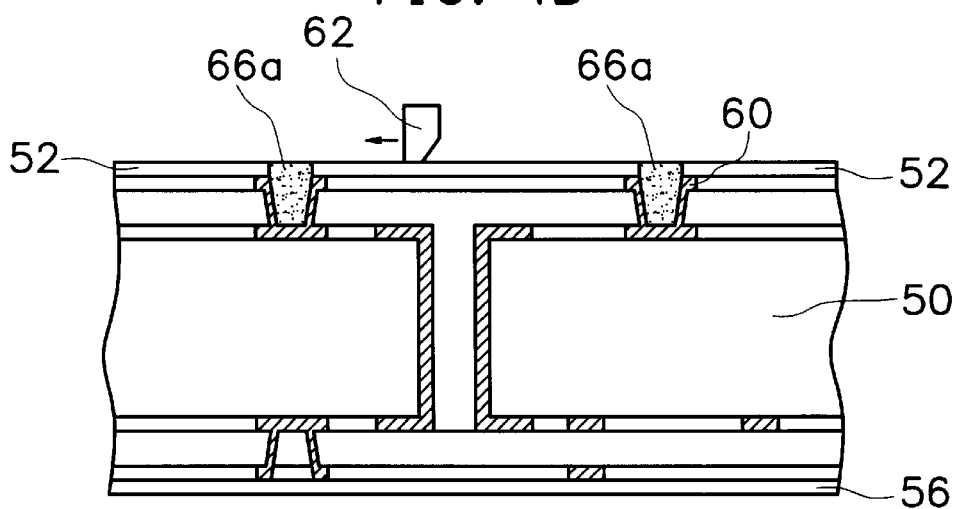

FIGS. 4A to 4C are schematic, cross-sectional views showing the process steps of one preferred embodiment of the invention for manufacturing plugs.

Referring to FIG. 4A, in a sealed printing chamber (not shown) a printed circuit board 50 is mounted on a baseplate 56, wherein the baseplate 56 comprises a heating unit (not shown). The printed circuit board 50, such as a common circuit board or BGA substrate having a blind via 60 formed therein, need to have a plug process performed thereon. A stencil 52 is then formed on the printed circuit board 50. Meanwhile, the blind via 60 on printed circuit board 50 is aligned to an opening 58 on the stencil 52. A sufficient amount of the preheated paste 64 is placed on the stencil. Preferably, enough paste 64 is applied so that one or two printing steps may be performed. The paste 64 is preheated to a temperature of about 40 to 90° C. before it is applied to the surface of the stencil. The sealed printing chamber (not shown) is then pumped down to a pressure in a range of between about 0.01 torr and 5 torr. The paste 64 is heated to a temperature of about 50 to 120° C. by the heating unit (not shown) mounted on the baseplate 56. A squeegee 62 is then used to plug these vias 60 with the paste 64.

The purpose of preheating the paste 64 is to reduce the viscosity of the paste 64 before it is applied to the surface of the stencil 52. The viscosity of the printed paste is reduced to prevent the paste 64 from forming voids. The heating temperature depends on the material of the paste 64. It should be just sufficient to reduce the viscosity but not high enough to cause thermal curing of the paste 64. Furthermore, in the present invention, the viscosity of the paste 64 is maintained by reducing the amount of the paste. However, in the conventional method the viscosity of the paste continues change due to solvent evaporation during the printing processes.

Referring to FIG. 4B, a plug 66 is then formed in the blind via 60 after the paste 64 is printed. To make sure the bubbles are removed, the chamber is then pressurized with air in a range of between about 350 torr and 1000 torr. This introduces a positive pressure to break the bubbles 68 that are sucked to the top surface of the paste 64. The positive pressure also helps to densify the paste in the plug. For extremely viscous paste 64, introducing a positive pressure of air at around 0.5 to 2.0 Kg/cm² is also helpful to remove bubbles 68 from the paste 64.

Referring to FIG. 4C, the sealed printing chamber is then returned to atmospheric pressure, after which it is pump down to around 0.01 torr to 5 torr. A squeegee 62 is then used to plug the via with paste 64. Under this vacuum environment, the squeegee 62 can scrape down the surface to ensure the surface uniformity of plug 66a.

A printed circuit board is illustrated in the preferred embodiment, but the present invention is not limited thereto. The present invention is also suitable for Multi-Chip Module-Laminates and Integrated Circuit Packaging, such as Ball Grid Arrays, Chip Scale Packages, and so on.

Figure 5:
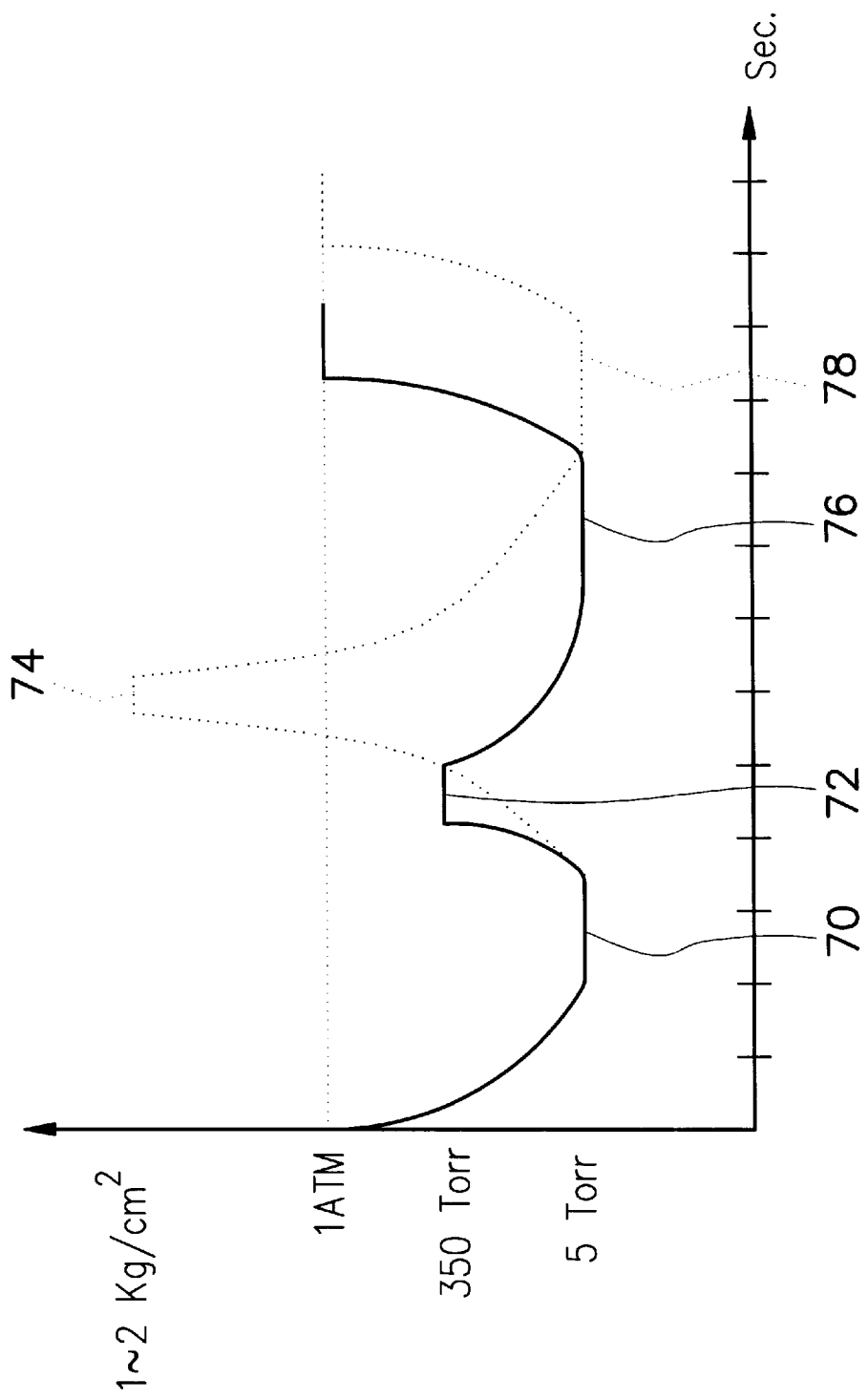
FIG. 5 is schematic diagram showing the relation between time and pressure in the manufacturing process for a plug according to one preferred embodiment of the invention.

FIG. 5 is a schematic diagram showing the relation between time and pressure in the manufacturing process of FIGS. 4A to 4C according to one preferred embodiment of the invention.

Referring to FIG. 5, the sealed printing chamber is pumped down to around 0.01 torr to 5 torr (numeric mark 70 shown in FIG. 5) in the printing step of the plug processes. To make sure the bubbles are removed and to densify the paste, the sealed printing chamber is pressurized with air at around 350 torr to 1000 torr (numeric mark 72 shown in FIG. 5). The sealed printing chamber is then pumped down to around 5 torr to 20 torr (numeric mark 76 shown in FIG. 5). The squeegee is used to remove the redundant paste and ensure the surface uniformity of the plug. This process is suitable for a paste having a viscosity at around 200 to 300 Pa.S.

For extremely viscous paste, for example, at around 600 to 100 Pa.S, the introduction of positive pressure with air to around 0.5 to 2.0 $Kg/cm^2$ (as numeric mark 74 shown in FIG. 5) is also helpful to remove bubbles 68 from the plug. The chamber is then pumped down to around 5 torr to 20 torr (as numeric mark 78 shown in FIG. 5). The squeegee is then used to scrape down the redundant paste and ensure the surface uniformity of the plug.

The advantages of the present invention are listed as follows:

1. The paste is mixed in a vacuum environment to protect the paste from air; hence, there no voids are formed in the plug.

2. The present invention provides a manufacturing apparatus for a plug that is operated in a vacuum. Therefore, the problem of forming voids in the plug is solved.

3. The present invention provides a method of manufacturing plug in vacuum environment, which can prevent the plug from forming voids and improves the quality of the plug.

4. The heating unit is applied to the mixed paste and even in the printing step for reducing the viscosity of the paste. The heating unit facilitates the printing step and avoids the formation of voids.

5. The present invention provides a premixing apparatus to precisely control the amount of the paste so as to improve the surface uniformity of the paste and prevent waste, as well.

6. In the present invention, both the cameras and the stencil are static and the only thing moving is the printed circuit board, so no further movement of the stencil and board occurs. However, in most conventional printers, the printed circuit board has to move to the printing area after each alignment, which may introduce and accumulate alignment inaccuracies. In the present invention, the distances between the cameras can be changed once the sizes of the stencil and printed circuit board are changed. Therefore, the present invention can be used for various sizes of printed circuit board.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of manufacturing a plug, used in a printed circuit board, comprising the steps of:

providing a sealed printing chamber having at least a baseplate mounted on a bottom surface and a transparent window mounted in the top surface of the sealed printing chamber;

sequentially mounting the printed circuit board and a stencil on the baseplate, wherein the print circuit board and the stencil each have a plurality of holes formed thereon;

using an alignment unit to align the holes of the printed circuit board and the holes of the stencil, wherein the alignment unit is mounted outside the transparent window and the alignment unit includes a plurality of cameras;

placing a preheated paste on the stencil;

adjusting the sealed printing chamber to a first pressure to perform a paste-printing step for filling the holes of the printed circuit board with paste;

adjusting the sealed printing chamber to a second pressure; and adjusting the sealed printing chamber to a third pressure to perform a scraping step to remove redundant paste.

2. A method according to claim 1, wherein the paste is heated by the baseplate during performing the printing and scraping steps of the paste.

3. A method according to claim 2, wherein the paste is heated to a temperature of about 50 to 120° C.

4. A method according to claim 1, wherein the printed paste is preheated to a temperature of about 40 to 90° C.

5. A method according to claim 1, wherein the first pressure is in a range of between 0.01 torr and 5 torr.

6. A method according to claim 1, wherein the second pressure is in a range of between about 350 torr and 1000 torr while the paste has a viscosity at around 200 to 300 Pa.S.

7. A method according to claim 1, wherein the second pressure is in a range of between about 0.5 and 2.0 $Kg/cm^2$ while the paste has a viscosity at around 600 to 1000 PaS.

8. A method according to claim 1, wherein the third pressure is in a range of between about 5 torr and 20 torr.

* * * * *